United States Patent

Freundlich et al.

[11] Patent Number: 5,851,310
[45] Date of Patent: Dec. 22, 1998

[54] STRAINED QUANTUM WELL PHOTOVOLTAIC ENERGY CONVERTER

[75] Inventors: Alexandre Freundlich; Philippe Renaud; Mauro Francisco Vilela; Abdelhak Bensaoula, all of Houston, Tex.

[73] Assignee: University of Houston, Houston, Tex.

[21] Appl. No.: 568,129

[22] Filed: Dec. 6, 1995

[51] Int. Cl.$^6$ ........................ H01L 31/06; H01L 31/0304; H01L 31/18
[52] U.S. Cl. .......................... 136/255; 136/252; 136/267; 257/21; 257/22; 257/458; 257/656; 438/93
[58] Field of Search ..................................... 136/252, 255, 136/262; 257/21–22, 458, 656; 437/5, 107, 110; 438/93

[56] References Cited

U.S. PATENT DOCUMENTS 5,496,415  3/1996  Barnham ................................. 136/255

FOREIGN PATENT DOCUMENTS

WO93/08606  4/1993  WIPO ................................... 136/255

OTHER PUBLICATIONS

Freundlich, A., et al., "InP–Based Quantum Solar Cells Grown by Chemical Beam Epitaxy," IEEE, Dec. 1994, pp. 1886–1889.
Renaud, P., et al., "Modeling p–i (Multi Quantum Well) –n solar cells: A contribution for a near optimum design," IEEE, Dec. 1994, pp. 1787–1790.
Barnham, K., et al., "Quantum Well Solar Cells," *Optoelectronics–Devices & Technology*, vol. 9, Iss. 4, pp. 483–498, Dec. 1994.
Araujo, G.L., et al "Efficiency of Multiple Quantum Well Solar Cells," 12th ECPVSC, Amsterdam, 1994.
Corkish, R., et al, "Recombination of Carriers in Quantum Well Solar Cells,"IEEE, 1993, pp. 675 –680.
Nelson, J., et al., "Steady State Carrier Escape from Single Quantum Wells," *J. Qu. Electr.*, Nov. 1992,pp. 2–23 + figures.

*Primary Examiner*—Aaron Weisstuch
*Attorney, Agent, or Firm*—Baker & Botts, L.L.P.

[57] ABSTRACT

An indium phosphide photovoltaic cell is provided where one or more quantum wells are introduced between the conventional p-conductivity and n-conductivity indium phosphide layer. The approach allows the cell to convert the light over a wider range of wavelengths than a conventional single junction cell and in particular convert efficiently transparency losses of the indium phosphide conventional cell. The approach hence may be used to increase the cell current output.

A method of fabrication of photovoltaic devices is provided where ternary InAsP and InGaAs alloys are used as well material in the quantum well region and results in an increase of the cell current output.

12 Claims, 3 Drawing Sheets

STRAINED QUANTUM WELL PHOTOVOLTAIC ENERGY CONVERTER

The U.S. Government has a paid-up license in this invention and may have the right in limited circumstances to require the patent owner to license others on reasonable terms as provided for by the terms of NASA SBIR program NASW-4093.

SPECIFICATION

1. Field of the Invention

This invention pertains to an improved solar cell. More particularly, a two-terminal photovoltaic device is provided wherein the insertion of a region of quantum wells in a conventional p-n junction cell based on indium phosphide provides improved photocurrent output and extends the effective band gap for absorption to longer wavelengths.

2. Background of the Invention

In conventional solar cells, a free electron and a hole are formed from absorption of a photon having an energy greater than the band gap energy of the absorbing material. These carriers rapidly thermalize to their respective band edges. The fundamental efficiency limitation in a conventional solar cell results from the trade-off between a low band gap absorbing material, which maximizes light absorption and hence the output current, and a high band gap absorbing material, which maximizes output voltage.

Applied to photovoltaic (PV) applications, InP has been shown to be much more radiation-resistant than GaAs or Si and therefore more suitable for space applications (I. Weinberg, D. J. Flood, in *Progress in Photovoltaics*, John Wiley & Sons Ltd, 1993). Radiation resistance can be an important property of solar cells for space application, since the cells are directly exposed to charged particles from the sun and an extended lifetime is needed for communication satellites and other applications. In theory, higher efficiencies in InP technology are possible with tandem cells, but subcells in series connections are difficult and the device structures are usually complex and expensive to realize, requiring growth of two sub-cells and an interconnect. Such devices are described in the U.S. Pat. No. 5,407,491.

The addition of "quantum wells" to the intrinsic (undoped) region of p-i-n solar cells has been suggested as an alternative to obtain higher efficiency solar cells (K. W. J. Barnham and G. Duggan, *J. Appl. Phys.* 67, 1990, p.3490). A "quantum well" is briefly defined as a heterostructure comprised of two or more semiconductor materials having different band gaps and where at least one of the semiconductor materials (the well material) has a smaller band gap than the largest band gap available in the combination and exhibits a thickness below about 20 nanometers (nm). The thickness of the larger band gap (barrier) material is not so critical, but in practice is generally below 100 nm. A carrier in the well region is subjected to a potential barrier arising from the presence of a wider band gap in the surrounding barrier material. This results in the quantization of energy states in the well, and these additional energy states may then absorb light having longer wavelength than that absorbed by the wide band gap material.

A plurality of quantum wells offers the possibility of increased light absorption and higher current output. A multi-quantum well (MQW) is a periodic repetition of well material and barrier material. The well and barrier materials and their thicknesses may be different. The MQW is always initiated and terminated with barrier material.

An MQW system is incorporated into the intrinsic (i–) region of a conventional p-i-n solar cell, where dopant concentrations are low and electrical resistivity is high. The effective band gap for absorption corresponds to the lower band gap of the well plus electron and hole confinement energies, while the output voltage is determined by the wider band gap of the barrier in the conventional part of the cell. In principle, as long as the i-region charged impurity level is below about $10^{15}$–$10^{16}$ cm$^{-3}$ (below 1 ppm), the built-in field extends across the whole intrinsic region and enhancement of photo-absorbed current will be maintained in a forward bias ("Modeling p-i (Multi-Quantum Well)-n Solar Cells," First WCPEC, IEEE, 1994, p. 1787).

Ideally, the barrier and conventional material should be the widest direct band gap material possible and the wells should be made with the smallest possible band gaps. On the other hand, to avoid defect formation and degradation of the photovoltaic properties, large crystal lattice mismatches between barrier and well material are prohibited. Also, close lattice matching allows for thick i-region growth (0.4–1 μm), which increases photon absorption in the intrinsic region. Despite the large strain involved in some heterostructures (3.1% lattice mismatch between InP and InAs), perfectly strained superlattices with thicknesses up to 1 μm were achieved (A. Freundlich, A. H. Bensaoula, A. Bensaoula, *J. Crystal Growth* 127, 1993, p. 246.) Nevertheless, strain limitations are important in selecting the materials for quantum wells, and differences in crystal lattice distances of the materials used must be carefully considered. Means for decreasing the effects of crystal lattice mismatches are also needed.

The efficiency of a conventional indium phosphide solar cell is about 19 per cent (AMO). What is needed is a solar cell made of materials which are closely lattice-matched to indium phosphide and which maintains most of the voltage output corresponding to the band gap width of indium phosphide but has higher current output from additional absorption of longer wavelength light than is absorbed by indium phosphide. The improved indium phosphide-based quantum well solar cell should consequently result in an additional increase of the short circuit currents and, when other parameters are optimized, in device efficiency.

SUMMARY OF THE INVENTION

A single-junction Indium Phosphide-based solar cell to achieve higher conversion efficiencies over an extended wavelength of radiation is provided. The insertion of a InGaAs/InP, InAsP/InP or InAsP/GaInP multi-quantum well (MQW) in the intrinsic region of a (p-i-n) InP solar cell can enhance considerably the efficiency by converting InP gap-transparency induced photon losses. This single junction InP quantum well solar cell will, therefore, reach higher current output. In principle, the voltage output can be comparable to that of a conventional InP cell.

An indium phosphide (InP) based solar cell having a quantum well region sandwiched between the conventional n-type and p-type regions of the cell is provided. It is shown that such quantum well solar cell extends the cell photoconversion to wider wavelength region than a traditional p-n junction cell. The onset wavelength of absorption or photoconversion is provided by the apparent band gap of the quantum well region (band gap of the well plus hole and electron confinement energies). It is also demonstrated that compared to a traditional p-n junction cell the quantum well solar cell exhibits a much more efficient conversion of photons located in the vicinity of the band gap of the material used for the traditional p- and n-layers. Therefore, a quantum well solar cell can perform efficiently with thinner base thickness than those usually required for the traditional counterpart cells. Although experimental demonstrations have been made using a base thickness of 1 micrometer, it is believed, based on theoretical predictions, that even with base thickness in the range of 0.5 micron the relative degradation of the photocurrent characteristics is expected to be less than 5% for the QW cell while the degradation of the short circuit current characteristics and efficiency for the traditional cell exceeds 30%. The MQW cell can then be utilized to achieve higher radiation resistance and/or efficient heteroepitaxial cells. In general, defects generated in the cell result in a reduction of minority carrier diffusion lengths and hence a reduction in cell efficiency.

In one embodiment, the quantum well region is fabricated using indium gallium arsenide and indium phosphide acting respectively as well and barrier materials in the solar cell. In a second embodiment strained InAsP is provided as well material. In a third embodiment tensilely strained InGaP barriers are utilized in combination with InAsP wells to enhance the mechanical stability of the cells and prevent a degradation of device characteristics with increasing number of wells.

A method of growing the MQW solar cells is provided, the growth temperature being between about 300° C. and about 650° C.

DETAILED DESCRIPTION OF PREFERRED EMBODIMENT

Figure 1:
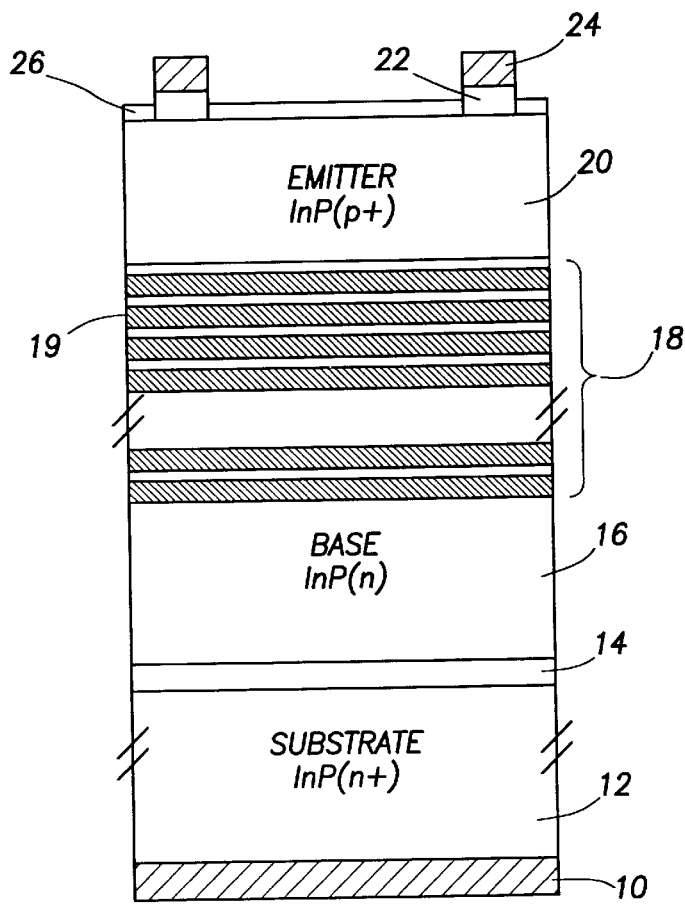
FIG. 1 is a sketch of a solar cell having multiple quantum wells.

Referring to FIG. 1, an MQW system incorporated into the intrinsic region of a conventional p-i-n indium phosphide (InP) solar cell is shown. The cell is fabricated on substrate 12, the top layer of which is lattice-matched to indium phosphide and the bottom surface of which has thereon back contact 10. Indium phosphide or other suitable materials well-known in the art may be used as a substrate with buffer layers to accommodate crystal lattice-matching requirements between the sublayer and the top layer of the substrate. A cell of indium phosphide, consisting of back surface field 14, base 16, intrinsic region 18, and emitter 20, is shown. Other alloys may be used if lattice-matched with indium phosphide. The cell is grown by any known technique, such as liquid phase epitaxy (LPE), metal-organic chemical vapor deposition (MOCVD), or chemical beam epitaxy (CBE). CBE is a low-pressure (pressure less than 0.01 torr) growth technique using all gas or a combination of gas and solid source precursors. The gases can be either organometallics or hydrides of the elements of the desired alloys and dopants. Solid sources can be metals or metalloids of the desired alloys and dopants.

In the solar cell of this invention, intrinsic region 18 includes one or more quantum wells 19. The general requirements for achieving a satisfactory solar cell device, regardless of the nature of the quantum well materials, are that the quantum wells should be fabricated within the space charge region of the conventional p-n junction. This requires that the dopant levels in the intrinsic region of the cell be below about $5 \times 10^{16}$ cm$^{-3}$. A more preferred upper limit for the background dopants level in the QW region is $1 \times 10^{16}$ and the most preferred condition is to have a background doping level below $5 \times 10^{15}$ cm$^{-3}$.

The lowest possible background doping level is usually a function of the purity of the source materials and growth chamber conditions, as known to those skilled in the art of growing semiconductor films.

Because different elements are used in the fabrication of the heterostructures of this invention, in particular arsenic and phosphorus, it is necessary to grow the films with systems that provide fast switching between the flux and growth precursor elements and fast flux stabilization. Preferably, the switching and stabilization are attained in less than 10 seconds and more preferably in less than 1 second.

The fabrication system should also allow for a reasonably good control of the growth temperature and temperature fluctuations across the substrate should not exceed 50° C. and more preferably should not exceed 10° C. The system should also provide a reasonable uniformity in the flux distribution across the substrate. During the fabrication of a given layer, relative changes in composition or thickness should not exceed 30%, and more preferably should not exceed 5%.

The process temperatures for all the steps subsequent to the fabrication of the quantum well region should be maintained as low as practical to prevent degradation of the characteristics of the cell. Preferably, growth temperatures are kept below 650° C., more preferable is growth temperature below 600° C. and most preferred is temperatures below 530° C.

The growth conditions outlined above can be achieved in commercially available, MBE, CBE, or MOVPE systems, or in any type of hybrid combination of these growth systems or other standard III-V semiconductor fabrication techniques. The solar cells and quantum wells described herein have been fabricated using CBE. The apparatus and procedures suitable for use in the method of this invention are described in U.S. Pat. No. 5,407,491, which is hereby incorporated by reference for all purposes. Specifically, a Riber CBE32 system was utilized to grow the films described herein. Epitaxial growth occurs in a chamber from precursor material provided from solid source containers, from a high temperature channel through which hydride or other gases may enter the chamber and from a low-temperature channel through which organo-metallic compounds enter the chamber. A pyrometer is placed so as to measure the temperature of the surface of the epitaxial growth. A scanning electron gun and fluorescent screen are used to monitor crystal lattice-matching. Gases are provided to the chamber from sources through mass flow controllers and valves. Organo-metallic compounds containing precursor elements are added in bubblers and carried to the chamber in hydrogen gas.

Referring again to FIG. 1, quantum wells are grown in intrinsic region 18 at temperatures most preferably below about 530° C. Metal-organic compounds such as trimethyl-indium (TMI), triethyl-indium (TEI), and triethylgallium (TEG) are used to provide indium and gallium at the required temperatures. Pre-cracked arsine (AsH$_3$) is also employed in the proper proportions as a growth precursor.

The number of wells and barriers that can be included in a solar cell is a function of the background impurity concentration (N) and dielectric constant ($\epsilon$) of the material in the intrinsic region. The total thickness of the quantum well region in the solar cell of this invention should be below the associated space charge width (W) given by $$W=(2\epsilon V/qN)^{1/2}.$$

V is the built-in voltage of the one-side abrupt junction potential (about 0.9 volt for indium phosphide) and q is the electron charge. For a background impurity level of $1\times10^{15}$ cm$^{-3}$, W exceeds 1 micron. Given a thickness $d_1$ for the well region and a thickness $d_2$ to the barrier region, the number of periods that can be realized is an integer n that is smaller than $W/d_1+d_2$.

The materials used in the solar cells of this invention are limited to indium phosphide and alloys in the indium phosphide system. The following alloys are here considered alloys in the indium phosphide system: AlInAs, GaAsSb, InAsP, AlPSb, GaPSb, GaInAs, GaInAsP, GaInAsSb, AlInAsSb, GaInPSb, AlInAsSb, GaInPSb, AlInPSb, and AlGaPSb. These alloys have somewhat different energy band gaps, which may be desirable in some applications, and may be used as sub-cells. Similarly, indium gallium arsenide is used herein to include all alloys of indium gallium arsenide with the addition of iso-valent elements such as phosphorous, aluminum, and antimony in concentrations such that the lattice mismatch is less than 0.3 per cent compared to $In_{0.53}Ga_{0.47}As$.

Lattice-matching can be defined as no more than a 0.3 per cent variation in the lattice parameter with respect to the indium phosphide lattice constant; The lattice constant of the material in the indium phosphide system should be established prior to the fabrication of the device of this patent. Relative fluxes and growth temperatures and growth rates (usually growth system dependent) necessary to achieve lattice matching conditions and low impurity backgrounds need to be established prior to undertaking device fabrication. The alloy composition can be checked by X-ray diffraction of any other standard technique used for this purpose.

The method of fabrication is now provided for an $In_xGa_{1-x}As$ (0.48<x<0.55) and indium phosphide quantum well solar cell.

The quantum well region is fabricated by growing one or more periods of quantum wells. First, a barrier layer consisting of non-doped InP is deposited on the solar cell base. There is no upper limitation on this layer thickness. However, preferably this layer thickness is kept below 100 nm and most preferably below 50 nm. Then the growth of InGaAs is initiated to form a quantum well. The thickness of the well material is preferably between 0.3 and 20 nm, more preferably between 1 nm and 10 nm, and most preferably between 3 nm and 9 nm. The thickness of the well sets the onset for the absorption in the quantum well to the desired value. The InGaAs layer is then capped with an InP layer. The thickness of the top barrier is again kept below 100 nm.

A multiple quantum well (MQW) can be inserted by repeating the growth of InGaAs and InP layers. In order to achieve high quality quantum wells it is preferable to keep the growth temperature constant during the growth of the entire quantum well region. Furthermore, during the switching from InP to InGaAs the growth can be interrupted under phosphorous flux by stopping the In precursor. However, it is preferred to avoid long exposures of the InP surface to arsenic. Prior to starting the growth of InGaAs, phosphorous flux needs to be interrupted and As, In, and Gallium flux switched on. The interruption time once the phosphorus has been switched off and before turning on other elements should not exceed 10 sec. Furthermore, the surface should not be exposed for periods exceeding 30 seconds to As flux without In and Ga flux on and most preferably this switching time should be minimized to below one second for the best performance of the quantum well. The In and Ga precursors have to be introduced simultaneously and the flux ratio has to be kept constant during well fabrication. The well and barrier material are preferably grown at a growth rate in the range from about 0.1 to 10 microns per hour; more preferably the growth rates are in the range from about 0.1 to about 2 microns per hour. These growth rates are also applicable to all the cells in a tandem device. The thickness can be checked by high resolution X-ray diffraction.

The desired pressure range in the chamber depends on precursor compounds used and other factors, but is preferably in the range from about $10^{-7}$ torr to about $10^{-2}$ torr. More preferably, the pressure in the chamber should be between $10^{-5}$ and $5\times10^{-4}$ torr. The pressure measured in the chamber must be representative of the pressure at the substrate location.

After the quantum well region is achieved, the top emitter 20 is epitaxially grown. This emitter is preferably grown at a temperature below 650° C. and more preferably at a temperature below 550° C. and most preferably at a temperature below 530° C., so as to leave intact the properties of the multi-quantum well region. The lower range of temperature may be as low as 300° C. Contact layer 22 and front contact 24 are then applied using well-known methods. An antireflection coating 26 is usually applied over the top of the device.

Although indium phosphide is shown in FIG. 1, it should be clear that alloys in the indium phosphide system that are lattice-matched to indium phosphide may be also used.

Figure 2:
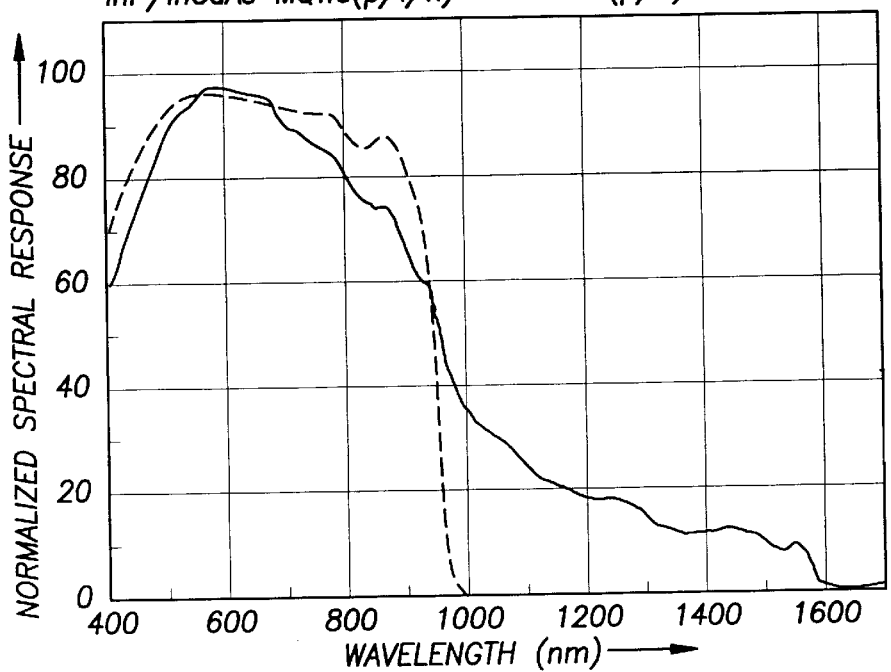
FIG. 2 is a graph comparing the spectral response of an indium phosphide quantum well solar cell (20 periods of InGaAs (6 nm) and InP(20 nm)) and a state-of-the-art indium phosphide cell.

FIG. 2 shows the spectral response of an InP quantum well solar cell fabricated using 20 periods of InGaAs (6 nm thick) and InP (20 nm thick) (solid line) and the spectral response of a state-of-the-art InP cell (dashed line). It is clear from the spectral response curves that the quantum well region extends the effective band gap for photon conversion to far below the energy band gap of InP. An appreciable photoresponse for the MQW cell is found for wavelengths in the 900 to 1500 nm region. This shows the effectiveness of the quantum wells in increasing the photoresponse of solar cells.

Strained alloys or binary materials in the indium phosphide system can also be used to form quantum wells. Strain in the quantum wells adds an additional degree of freedom toward the tailoring of band gap properties. However, one of the major shortcomings associated with the use of strained materials is related to the fact that special attention should be given to maintain the thickness of individual layers below a critical value, often referred to as the critical thickness where defect generation processes are initiated. Greater thicknesses lead to a degradation of the materials is optical and electric properties. Furthermore, in an association of several quantum wells, the individual constituent layer thickness should be kept below their critical thickness and also the total thickness of the heterostructure should be maintained below the critical thickness corresponding to the average value of strain in the QW region. Therefore, prior to the fabrication of a device containing strained materials it is necessary to determine experimentally the critical thicknesses associated with individual strained layers and the maximum number of periods that can be grown prior to relaxation of the material. Standard techniques sensitive to the presence of structural defects, such as transmission electron microscopy or X-ray diffraction, can be used for this purpose.

Figure 3:
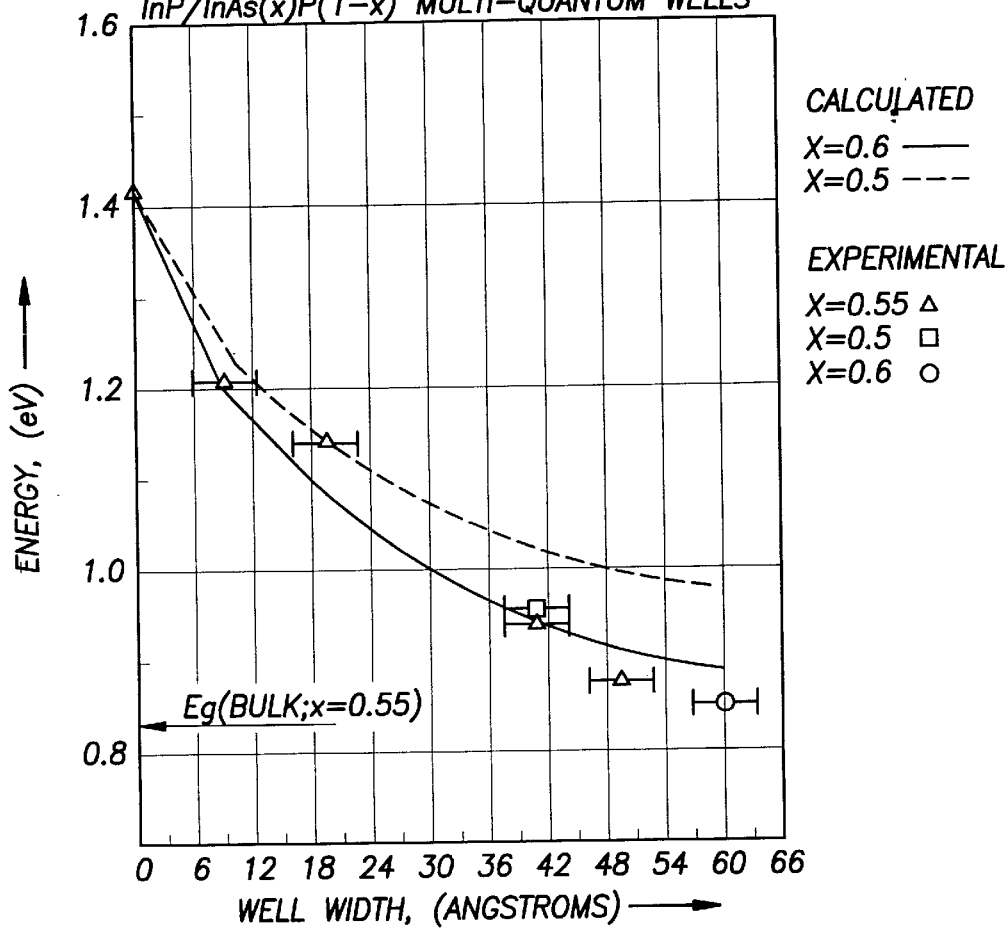
FIG. 3 is a graph showing the variation of the apparent band gap of different alloys of InAsP/InP quantum wells as a function of the well thickness.

The confinement energy in the quantum wells as a function of well thickness and composition can be calibrated using standard techniques such as photoluminescence reflectivity or transmission spectroscopy. An example of the variation of apparent band gap of a strained quantum well in the InAsP/InP system is provided in FIG. 3. Confinement energies in multi-quantum wells fabricated from $InAs_xP_{1-x}$ (x=0.5 to 0.6) and InP were measured by low-temperature (10K) photoluminescence. Well widths varied from about 0.8 to about 6 nm. The data indicate that differences in strain in the MQW region have an effect on confinement energies.

Figure 4:
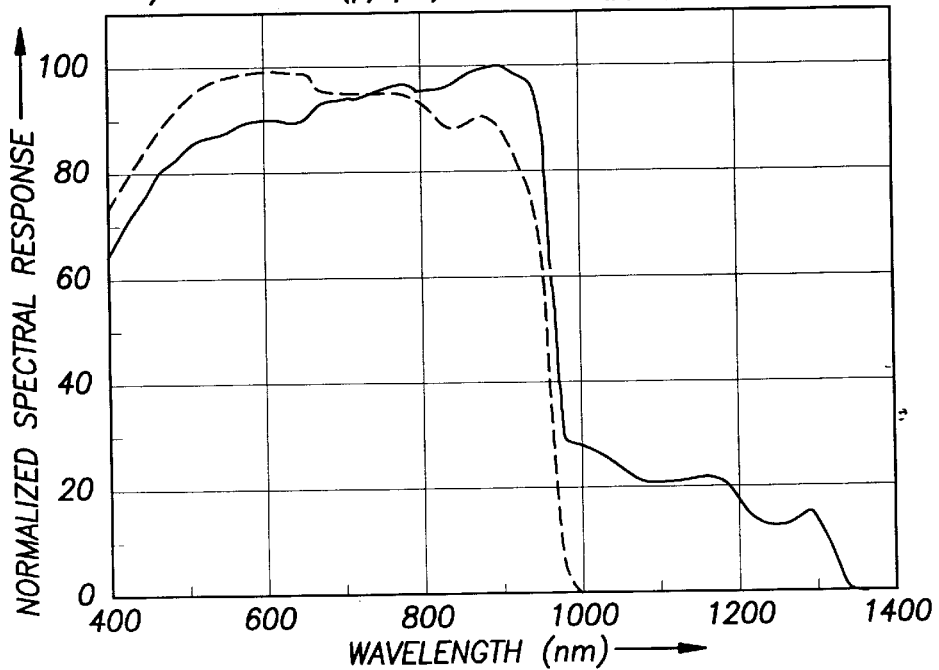
FIG. 4 is a graph comparing spectral response of an indium phosphide quantum well solar cell (10 periods of InAsP (6 nm) and InP(20 nm) and a state-of-the-art indium phosphide cell.

FIG. 4 shows the spectral response of an InP quantum well solar cell fabricated using 10 periods of InAsP (6 nm) and InP(20 nm) quantum wells (solid line) and the spectral response of a state-of-the-art InP cell. This curve indicates a more efficient conversion for the photons located in the InP near band gap region (800–900 nm). Therefore, because of an improved collection efficiency for near InP band gap photons, the MQW solar cell should be able to perform with a much thinner base than a conventional InP cell.

Figure 5:
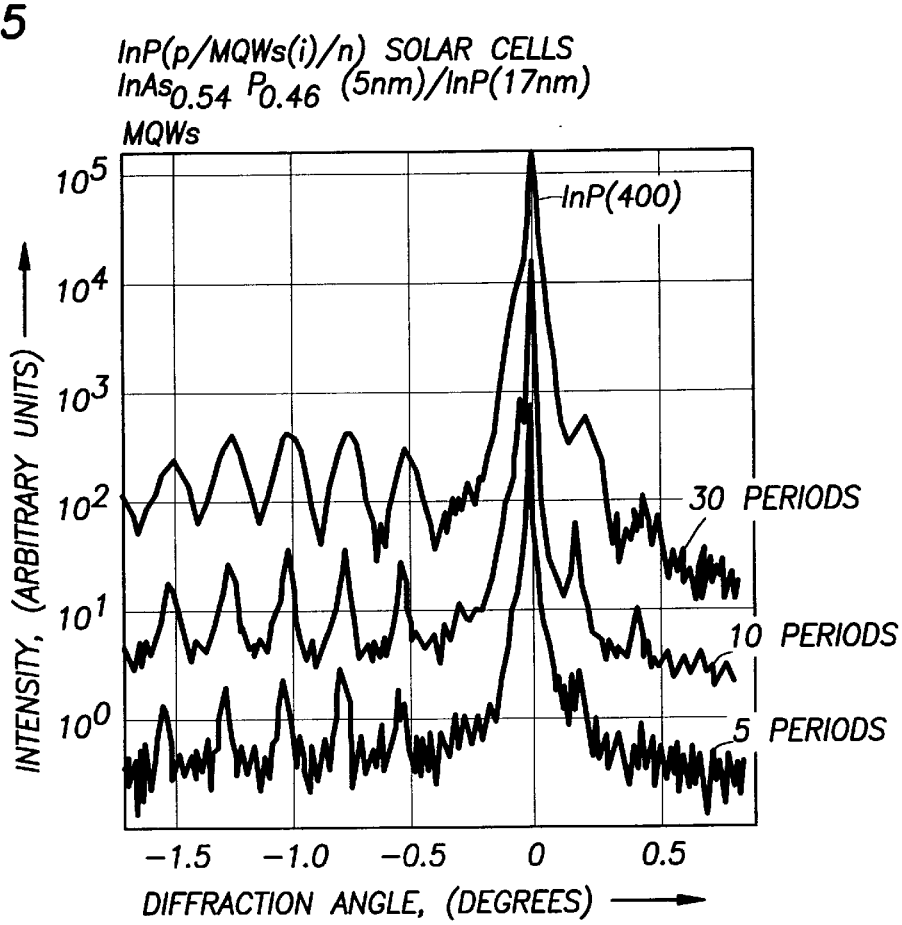
FIG. 5 shows high-resolution X-ray diffraction patterns of 5, 10, and 30 period strained InAsP/InP quantum well solar cells.

Increasing the number of wells in the quantum well region generally results in an increase of the cell photocurrent and an enhancement of the photoconversion rate for photons below the band gap of the traditional material of the cell. However, the total number of wells that can be fabricated is limited by the critical thickness of the quantum well region. FIG. 5 shows that, for example, while a 10-period InAsP and InP (As composition 0.5) quantum well cell exhibits strained layers, the line-broadening of x-ray diffraction patterns shows that a relaxation of strain and degradation of structural properties has occurred for a 30-period quantum well region.

Figure 6:
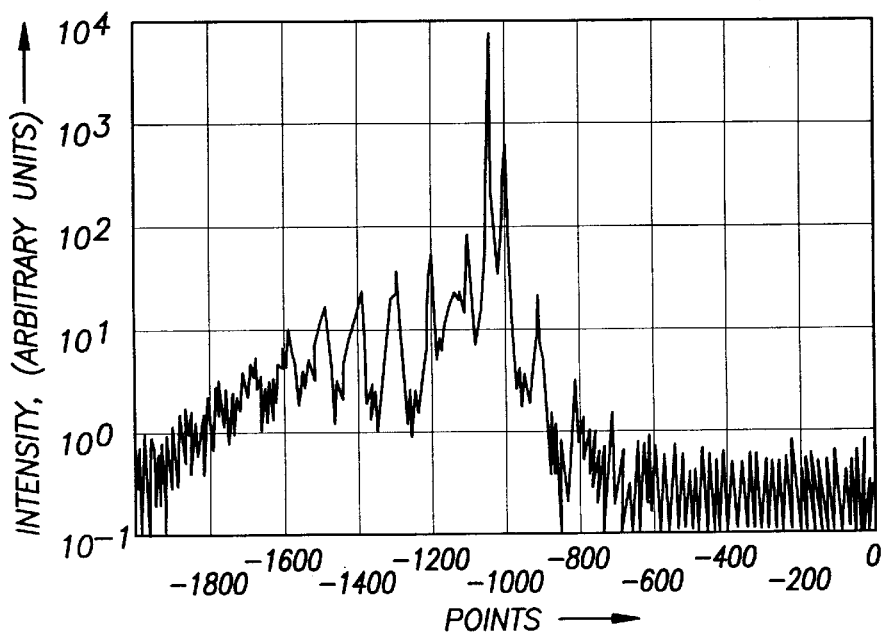
FIG. 6 shows high-resolution X-ray diffraction pattern of a 30 period quantum well solar cell where the barrier material is InGaP (Ga composition of about 15%).

We have also discovered a technique to overcome this limitation caused by degradation of structural properties with increase in periods of quantum wells. The total critical thickness of the quantum well region can be increased by alternating layers that, with respect to the traditional part of the cell, are alternately in tensile and compressive strain. This technique will reduce the overall strain magnitude in the heterostructure. Of course, the thickness of each individual layer is required to stay below its critical thickness. In the InAsP system this can be achieved by introducing, for example, layers of InGaP in the barrier. FIG. 6 shows the high-resolution X-ray diffraction pattern of a 30-period quantum well solar cell where the barrier material is InGaP (Ga composition of about 15%). The InAsP width and composition are similar to that provided for the cells analyzed in FIG. 5. Line width of the satellite diffraction peaks associated with the quantum well region indicate the absence of strain-induced degradation.

EXAMPLES

Results of measurements of solar cell properties and parameters were presented in the paper "InP-based quantum well solar cells grown by chemical beam epitaxy," Proc. of *First World Conference on Photovoltaic Energy*, Dec. 5–9, 1994, p. 1886–89.

InGaAs/InP Quantum Well

Quantum well solar cells of indium phosphide were grown using the method of this invention. A back surface field having a thickness of about 1 micron was grown. Silicon dopant concentration was at least about $2\times10^{18}$ $cm^{-3}$. Growth temperatures were in the range from about 480° to about 550° C. A base layer having thickness in the range from about 1 to 5 microns was then grown. Silicon dopant concentrations were in the range of 0.4 to $5\times10^{17}$ $cm^{-3}$. Growth temperatures were in the range from 490° to 550° C. A quantum well region was then fabricated. The total thickness of this region was between 0.1 and 0.8 microns. No dopant was used and growth temperatures were between 460° and 530° C. An emitter layer having thickness in the range from 0.1 to 0.6 microns was then grown. Beryllium concentration were in the range of 1 to $5\times10^{18}$ $cm^{-3}$. Growth temperatures were in the range from 490° to 550° C. A contact layer was then grown. The contact layer thickness was from 0.1 to 0.5 microns. Beryllium concentrations were greater than $10^{18}$ per $cm^{-3}$. Growth temperatures were in the range of 460° to 530° C. A metallization layer was then added using standard techniques.

All solar cells were fabricated using identical n- and p-doping levels and the (p-emitter) and (MQW+n base) thickness was kept constant in all the samples. Table 1 shows structural parameters of the cells. Doping and thickness parameters were previously optimized for conventional indium phosphide (p/n) solar cells (conventional cell AM 1.5 efficiencies are 13% without antireflection coating (ARC) and 18.7% with ARC) and were reported in U.S. Pat. No. 5,407,491, referenced above). Well and barrier width were kept constant and equal to 6 nm and 20 nm, respectively. 10, 20, and 30 period quantum wells were included in the intrinsic region of the cell. Gold was utilized as front and back ohmic contacts. Typical cell active area (corrected for grid shadowing) was 0.047 $cm^2$.

TABLE 1

| Region | Material | Thickness | Doping Level |
|---|---|---|---|
| Contact | InGaAs(p) | 0.2 μm | >8 × 10$^{18}$ |
| Emitter | InP(p) | 0.2 μm | 2 × 10$^{18}$ |
| Intrinsic or MQW | (1) MQW of InGaAs/InP N = 10,20,30 | N × 0.026 | <10$^{15}$ |
| | (2) MQW of InAsP/InP N = 5,10,20,30 | N × 0.026 | <10$^{15}$ |
| Base | InP(n) | 2-(N × 0.026) μm | 1 × 10$^{17}$ |

As expected, the addition of MQWs in the intrinsic region of the indium phosphide solar cells extends the effective band gap for absorption toward longer wavelengths (up to 1500 nm for InGaAs/InP MQWs). Typical spectral response of an indium phosphide (p-MQW-n) solar cell containing InGaAs wells is represented in FIG. 2 and is characterized by a non-negligible photoresponse in the 900 to 1500 nm region. Besides the n=1 excitonic type absorption, several absorption edges corresponding to higher quantization levels are observed. For InGaAs MQWs, the long wavelength photoresponse increases by increasing the number of wells from 10 to 20 and saturates for 30 periods. These results are qualitatively in good agreement with expected behavior.

InAsP/InP Quantum Well

The well compositions utilized for indium phosphide cells containing $InAs_xP_{1-y}$ are x=0.37 and x=0.55 and x=0.7, and they offer a set of MQW absorption edges at 1.1, 1.3, and 1.5 $\mu$m, respectively. However, as the As composition is increased in the well region, the lattice mismatch induced strain energy increases in the MQW. This excess of energy for thicknesses exceeding a threshold value called the "critical thickness" may result in the formation of dislocations and lead to a degradation of electronic properties.

In the absence of plastic relaxation the indium phosphide solar cells containing InAsP/InP MQW region are characterized by an increase of the short circuit current with respect to homojunction cells, as shown in Table 2, where the symbols have the following meaning: $I_{cc}$ is the short circuit current; $V_{oc}$ is the open circuit voltage; FF is the fill factor, which is defined as the ratio of the maximum power output divided by $I_{cc} \times V_{oc}$; and $\eta$ is the efficiency, which is electrical power output divided by incident power.

TABLE 2

I-V characteristics without Antireflection Coating

| | I-region | $I_{cc(mA/cm-2)}$ | $V_{oc}$ (volts) | FF | $\eta$(AM1) |
|---|---|---|---|---|---|
| InP (p/n) | None | 20 | 0.82 | 0.77 | 13.3% |
| InP (p-i-n) | 0.3 $\mu$m undoped InP | 20.2 | 0.75 | 0.74 | 12.5% |
| InP(p-MQW-n) | 10 period InAsP/InP | 26.2 | 0.56 | 0.67 | 11% |
| InP(p-MQW-n) | 20 period InAsP/InP | 28.4 | 0.52 | 0.53 | 8.5% |

For the $InAs_{0.35}P_{0.65}$ well the short circuit current $I_{cc}$ increases with increasing number of periods up to 20 periods of MQW. For 30 periods, $I_{cc}$ decreased, indicating increased presence of dislocations in heterostructures having a large number of periods. It is difficult to draw conclusions on whether this current reduction is related to the decrease of minority carrier lifetime, associated with dislocations, or a more intrinsic phenomena.

The I–V characteristics of the MQW solar cells when compared to their conventional indium phosphide (p/n) counterpart is characterized by a systematic drop of the open circuit voltage ($V_{oc}$). The open circuit voltage seems also to decrease by increasing the number of periods.

However, for several structures the relative increase of the short circuit current ($I_{cc}$) is larger than the associated voltage drop. The efficiency of several MQW solar cells approached that of conventional solar cells, despite the decreased fill factor, FF. Typical I–V characteristics (under AM1 simulator) of a 10- and 20- period $InAs_{0.35}P_{0.65}$/InP MQW solar cell is compared with its p-i(InP)-n counterpart in Table 2. For example, for a 10-period MQW cell, the $I_{cc}$ is improved by 30% while the voltage drop was 25%.

Furthermore, spectral response measurements shown in FIG. 4 of our best MQW InAsP/InP cells indicate a more efficient conversion for the photons located in the indium phosphide near band gap region (800–900 nm). Therefore, owing to an improved collection efficiency for photons having energy near the indium phosphide band gap energy, the MQW solar cell will be able to perform with a much thinner base than a conventional indium phosphide cell. This will have several advantages, including lower fabrication costs and less susceptibility to radiation damage.

It should be understood that n- and p-type layers described in this invention are reversible, i.e., the sequence can begin with either type and a change to the other type can occur at a homojunction or interface between layers. It should also be understood that the cells of this invention may be used as subcells in tandem solar cells.

The invention has been described with reference to its preferred embodiments. Those of ordinary skill in the art may, upon reading this disclosure, appreciate changes or modifications which do not depart from the scope and spirit of the invention as described above or claimed hereafter.

What is claimed is:

1. A semiconductor photovoltaic energy conversion cell of the n-i-p or p-i-n junction type, comprising:

a base being lattice-matched to indium phosphide and being respectively of the n- or p-type;

an intrinsic region having a plurality of quantum wells therein, wherein each quantum well has a thickness and is formed of strained alloys or binary materials in the indium phosphide system, the plurality of quantum wells having a total thickness;

an emitter region-being lattice-matched to indium phosphide and being respectively of the p- or n-type; and electrical contacts to the base and emitter regions.

2. The energy conversion cell of claim, 1 wherein the thickness of the individual quantum wells is below a critical thickness at which defect generation processes are initiated.

3. The energy conversion cell of claim 1 wherein the total thickness of the quantum wells is less than the critical thickness corresponding to the average value of strain in the quantum well region.

4. The energy conversion cell of claim 1 wherein the quantum wells are layers of indium arsenide phosphide.

5. The energy conversion cell of claim 1 wherein the quantum wells and barriers are alternately in compression and and tension with respect to the base or emitter regions of the cell.

6. The energy conversion cell of claim 5 wherein the quantum wells and barriers are layers of indium arsenide phosphide and indium gallium phosphide.

7. The energy conversion cell of claim 1 wherein the quantum well region includes individual quantum wells strained in compression and tension with respect to the base or emitter regions of the cell.

8. The energy conversion cell of claim 7 wherein the quantum wells are layers of indium arsenide phosphide and strained indium gallium arsenide.

9. A method for forming a semiconductor photovoltaic energy conversion cell of the n-i-p or p-i-n conductivity type, comprising the steps of:

providing a substrate being respectively of the n- or p-type conductivity material having a top layer lattice-matched with indium phosphide;

providing over the substrate a base being respectively of the n- or p-type conductivity material lattice-matched to the top layer of the substrate;

forming over the base an intrinsic region having a plurality of quantum wells therein, wherein each quantum well has a thickness and is made of strained alloys or binary materials in the indium phosphide system, the plurality of quantum wells forming a total thickness;

forming an emitter region being respectively of the p- or n-type and lattice-matched to indium phosphide; and forming electrical contacts to the base and emitter regions.

10. The method of claim 9 wherein the intrinsic region and the emitter region are formed at temperatures less than about 600° C.

11. The method of claim 9 wherein the intrinsic region and the emitter region are formed at temperatures less than about 530° C.

12. The method of claim 9 wherein in the step of forming the intrinsic region having a plurality of quantum wells a step of flux switching and stabilization during changes of elements is caused to occur in a time of less than about 10 seconds.

* * * * *